(12) United States Patent
Imanishi

(10) Patent No.: US 10,197,862 B2
(45) Date of Patent: Feb. 5, 2019

(54) LIQUID CRYSTAL DISPLAY DEVICE AND MANUFACTURING METHOD THEREOF

(71) Applicant: Japan Display Inc., Tokyo (JP)

(72) Inventor: Yasuo Imanishi, Tokyo (JP)

(73) Assignee: Japan Display Inc., Tokyo (JP)

( * ) Notice: Subject to any disclaimer, the term of this patent is extended or adjusted under 35 U.S.C. 154(b) by 495 days.

(21) Appl. No.: 14/879,446

(22) Filed: Oct. 9, 2015

(65) Prior Publication Data

US 2016/0103368 A1 Apr. 14, 2016

(30) Foreign Application Priority Data

Oct. 14, 2014 (JP) .................................. 2014-210116

(51) Int. Cl.
| | | |
|---|---|---|
| *G02F 1/1337* | (2006.01) | |
| *G02F 1/1368* | (2006.01) | |
| *G02F 1/1341* | (2006.01) | |
| *H01L 27/12* | (2006.01) | |

(52) U.S. Cl.
CPC ...... *G02F 1/133723* (2013.01); *G02F 1/1341* (2013.01); *G02F 1/1368* (2013.01); *G02F 1/133788* (2013.01); *H01L 27/1262* (2013.01); *Y10T 428/1023* (2015.01)

(58) Field of Classification Search
CPC ......... G02F 1/133723; G02F 1/133788; G02F 1/1341; G02F 1/1368; H01L 27/1262; Y10T 428/1023
See application file for complete search history.

(56) References Cited

U.S. PATENT DOCUMENTS

| | | |
|---|---|---|
| 2006/0061719 A1 | 3/2006 | Tomioka et al. |
| 2010/0066961 A1 | 3/2010 | Matsui et al. |
| 2012/0013836 A1* | 1/2012 | Teraoka ............ G02F 1/133711 349/124 |

(Continued)

FOREIGN PATENT DOCUMENTS

| | | |
|---|---|---|
| CN | 104059227 A | 9/2014 |
| JP | H09-297312 A | 11/1997 |

(Continued)

OTHER PUBLICATIONS

Japanese Office Action dated May 8, 2018 for corresponding Japanese Patent Application No. 2014-210116.

*Primary Examiner* — Sophie Hon
*Assistant Examiner* — Sow Fun Hon
(74) *Attorney, Agent, or Firm* — TYPHA IP LLC

(57) ABSTRACT

A liquid crystal display device includes: a TFT substrate formed with an alignment film on a pixel; a counter substrate disposed opposite to the TFT substrate and formed with an alignment film on a top surface on the TFT substrate side; and a liquid crystal sandwiched between the TFT substrate and the counter substrate. In the liquid crystal display device, the alignment film is configured of a first alignment film layer contacting the liquid crystal layer and having at least one kind of polyimide and a second alignment film layer formed below the first alignment film layer and having at least one kind of polyimide, the first alignment film layer is a material that is enabled to provide liquid crystal alignment regulating force by applying polarized light, and the first alignment film layer and the second alignment film layer contain a common polyimide structure.

12 Claims, 14 Drawing Sheets

(56) References Cited

U.S. PATENT DOCUMENTS

2012/0057115 A1\* 3/2012 Kunimatsu ....... G02F 1/133723
　　　　　　　　　　　　　　　　　　　　349/123

FOREIGN PATENT DOCUMENTS

| | | |
|---|---|---|
| JP | 2001-300454 A | 10/2001 |
| JP | 2004-206091 A | 7/2004 |
| JP | 2010-72011 A | 4/2010 |
| WO | 2010/106915 A1 | 9/2010 |
| WO | 2013/111836 A1 | 8/2013 |

\* cited by examiner

FIG. 10

TABLE 1

| SAMPLE NO. | COMPONENT RATIO (%) | | | CHARACTERISTICS | | | |
|---|---|---|---|---|---|---|---|
| | POLYMER (4) | POLYMER (5) | POLYMER (6') | ANCHORING FORCE (mJ/m$^2$) | INITIAL FILM STRENGTH (kN/m) | RELATIVE FILM STRENGTH (%) | LUMINANCE RELAXATION CONSTANT (TIME) |
| COMPARATIVE EXAMPLE 1 | 50 | 50 | 0 | 1.5 | 0.67 | 35 | 205 |
| 1-1 | 50 | 50 | 1 | 1.6 | 0.72 | 42 | 180 |
| 1-2 | 49 | 49 | 3 | 1.5 | 0.70 | 58 | 165 |
| 1-3 | 48 | 48 | 5 | 1.6 | 0.68 | 67 | 130 |
| 1-4 | 46 | 46 | 8 | 1.4 | 0.74 | 72 | 140 |
| 1-5 | 44 | 44 | 12 | 1.5 | 0.72 | 70 | 165 |
| 1-6 | 40 | 40 | 20 | 1.2 | 0.70 | 74 | 190 |
| 1-7 | 35 | 35 | 30 | 0.9 | 0.68 | 72 | 220 |

FIG. 11

TABLE 2

| SAMPLE NO. | COMPONENT RATIO (%) | | | CHARACTERISTICS | | | |
|---|---|---|---|---|---|---|---|
| | POLYMER (4) | POLYMER (5) | POLYMER (6') | ANCHORING FORCE (mJ/m²) | INITIAL FILM STRENGTH (kN/m) | RELATIVE FILM STRENGTH (%) | LUMINANCE RELAXATION CONSTANT (TIME) |
| COMPARATIVE EXAMPLE 1 | 50 | 50 | 0 | 1.5 | 0.67 | 35 | 205 |
| 2-1 | 50 | 50 | 1 | 1.6 | 0.71 | 44 | 170 |
| 2-2 | 49 | 49 | 3 | 1.5 | 0.72 | 60 | 150 |
| 2-3 | 48 | 48 | 5 | 1.6 | 0.68 | 65 | 125 |
| 2-4 | 46 | 46 | 8 | 1.4 | 0.71 | 71 | 135 |
| 2-5 | 44 | 44 | 12 | 1.5 | 0.72 | 72 | 150 |
| 2-6 | 40 | 40 | 20 | 1.4 | 0.71 | 73 | 170 |
| 2-7 | 35 | 35 | 30 | 1.0 | 0.79 | 70 | 200 |

FIG. 12

TABLE 3

| SAMPLE NO. | COMPONENT RATIO (%) | | | CHARACTERISTICS | | | |
|---|---|---|---|---|---|---|---|
| | POLYMER (4) | POLYMER (5) | POLYMER (6') | ANCHORING FORCE (mJ/m²) | INITIAL FILM STRENGTH (kN/m) | RELATIVE FILM STRENGTH (%) | LUMINANCE RELAXATION CONSTANT (TIME) |
| COMPARATIVE EXAMPLE 1 | 50 | 50 | 0 | 1.5 | 0.67 | 35 | 205 |
| 3-1 | 50 | 50 | 1 | 1.5 | 0.71 | 41 | 185 |
| 3-2 | 49 | 49 | 3 | 1.6 | 0.70 | 54 | 170 |
| 3-3 | 48 | 48 | 5 | 1.7 | 0.69 | 65 | 150 |
| 3-4 | 46 | 46 | 8 | 1.5 | 0.71 | 70 | 140 |
| 3-5 | 44 | 44 | 12 | 1.3 | 0.66 | 68 | 190 |
| 3-6 | 40 | 40 | 20 | 1.0 | 0.64 | 69 | 205 |
| 3-7 | 35 | 35 | 30 | 0.7 | 0.65 | 70 | 260 |

FIG. 13

TABLE 4

| CONDITION NO. | TEMPORARY DRYING CONDITIONS |
|---|---|
| 1 | NOT PERFORMED |
| 2 | 50°C FOR ONE MIN. |
| 3 | 50°C FOR 5 MIN. |
| 4 | 70°C FOR ONE MIN. |
| 5 | 70°C FOR 5 MIN. |
| 6 | 100°C FOR ONE MIN. |
| 7 | 100°C FOR 5 MIN. |
| 8 | 120°C FOR ONE MIN. |
| 9 | 120°C FOR 5 MIN. |
| 10 | 150°C FOR ONE MIN. |
| 11 | 150°C FOR 5 MIN. |
| 12 | 180°C FOR ONE MIN. |
| 13 | 180°C FOR 5 MIN. |

FIG. 14

TABLE 5

| CONDITION NO. | 1-1 | 1-2 | 1-3 | 1-4 | 1-5 | 1-6 | 1-7 |
|---|---|---|---|---|---|---|---|
| 1 | AM | AM | AM | AM | AM | AM | AM |
| 2 | AM | AM | AM | AM | AM | AM | AM |
| 3 | AM | AM | AM | AM | AM | AM | AM |
| 4 | AM | AM | MD | MD | AM | AM | AM |
| 5 | MD | MD | DL | DL | MD | MD | AM |
| 6 | DL | DL | DL | DL | DL | DL | MD |
| 7 | DL | DL | DL | DL | DL | DL | DL |
| 8 | DL | DL | DL | DL | DL | DL | DL |
| 9 | DL | DL | DL | DL | DL | DL | DL |
| 10 | DL | DL | DL | DL | DL | DL | DL |
| 11 | DL | DL | AM | AM | AM | AM | DL |
| 12 | AM | AM | AM | AM | AM | AM | AM |
| 13 | AM | AM | AM | AM | AM | AM | AM |

NOTE: ABBREVIATION FOR CROSS SECTIONAL STRUCTURE
AM = AMORPHOUS, DL = TWO-LAYER STRUCTURE, MD = MULTIDOMAIN

LIQUID CRYSTAL DISPLAY DEVICE AND MANUFACTURING METHOD THEREOF

CLAIM OF PRIORITY

The present application claims priority from Japanese Patent Application JP 2014-210116 filed on Oct. 14, 2014, the content of which is hereby incorporated by reference into this application.

FIELD OF THE INVENTION

The present invention relates to a high-quality liquid crystal display device that improves viewing angle characteristics and display contrast and a manufacturing method thereof.

BACKGROUND OF THE INVENTION

Since liquid crystal display devices have merits such as high display quality, reduced thickness, reduced weight, and low power consumption, the use applications of the devices are expanding, and the devices are used for various use applications including mobile device monitors such as a mobile telephone monitor, digital still camera monitor, personal computer monitor, monitor intended for printing and design, medical monitor, and liquid crystal television. In association with the expansion of these use applications, it is demanded to further improve the image quality and the quality of the liquid crystal display device, and it is strongly demanded to improve luminance and to decrease power consumption by achieving higher transmittances specifically. Moreover, in association with the spread of the liquid crystal display device, a decrease in costs is also demanded.

In general, images are displayed on the liquid crystal display device in which an electric field is applied to the liquid crystal molecules of a liquid crystal layer sandwiched between a pair of substrates to change the alignment direction of the liquid crystal molecules and the change causes changes in the optical properties of the liquid crystal layer for displaying images. The alignment direction of the liquid crystal molecules when the electric field is not applied is defined by an alignment film that the surface of a polyimide thin film is rubbed. Conventionally, in an active matrix liquid crystal display device having a switching element such as a thin film transistor (TFT) for each pixel, an electrode is individually provided on a pair of substrates between which a liquid crystal layer is sandwiched, an electric field is set to a so-called vertical electric field that the direction of the electric field applied to the liquid crystal layer is almost perpendicular to the substrate surface, and images are displayed using the optical rotatory power of liquid crystal molecules forming the liquid crystal layer. For representative liquid crystal display devices in a vertical field mode, liquid crystal display devices in a twisted nematic (TN) mode and a vertical alignment (VA) mode are known.

In liquid crystal display devices in the TN mode and the VA mode, one of large problems is a narrow viewing angle. Therefore, as display modes to achieve wider viewing angles, an in-plane switching (IPS) mode and a fringe-field switching (FFS) mode, which is one type of the IPS mode, are known.

The IPS mode and the FFS mode are a so-called transverse electric field display mode in which an electrode is formed on one of a pair of substrates and an electric field to be generated has a component nearly in parallel with the substrate surface. Liquid crystal molecules forming a liquid crystal layer are rotated in a plane nearly in parallel with the substrate, and images are displayed using the birefringence of the liquid crystal layer. The IPS mode and the FFS mode are advantageous in that the viewing angle is wide and the load capacity is low as compared with the previously existing TN mode because of the in-plane switching of the liquid crystal molecules, for example. The liquid crystal display devices in the IPS mode and the FFS mode are regarded as new promising devices that replace liquid crystal display devices in the TN mode, and are in a rapid progress in these years.

In the liquid crystal display device, the orientation state of the liquid crystal molecules in the liquid crystal layer is controlled by the presence or absence of an electric field. In other words, upper and lower polarizers provided on the outer sides of the liquid crystal layer are set in the completely orthogonal state, a phase difference is generated due to the orientation state of the liquid crystal molecules between the polarizers, and light and dark states are formed. In order to control the orientation state in which no electric field is applied to the liquid crystal molecules, this control is achieved in which a polymer thin film called an alignment film is formed on the surface of the substrate and the liquid crystal molecules are arrayed in the array direction of polymers due to an intermolecular interaction caused by van der Waals force between a polymer chain and the liquid crystal molecule on the interface. This interaction is also referred to as alignment regulating force, the provision of a liquid crystal aligning function, or an alignment process.

Polyimide is often used for an alignment film of a liquid crystal display device. In a forming method for the alignment film, polyamic acid that is a polyimide precursor is dissolved in various solvents, and coated on a substrate by spin coating or printing, the substrate is heated at high temperature at a temperature of 200° C. or more, the solvents are removed, and the polyamic acid is imidized to polyimide by cyclization. The thin film has a thickness of about 100 nm in the imidization. The surface of this polyimide thin film is rubbed in a certain direction using a rubbing cloth, polyimide polymer chains on the surface are aligned in the rubbing direction, and then it is achieved that polymers on the surface are in a high anisotropic state. However, there are problems such as the occurrence of static electricity and foreign substances caused by rubbing and ununiform rubbing caused by irregularities on the surface of the substrate, and a photo-alignment method is becoming adopted in which polarized light is used to control molecular orientations with no need to contact a rubbing cloth.

The photo-alignment method for a liquid crystal alignment film includes photoisomerization type photo-alignment that the geometry in a molecule is changed by applying a polarized ultraviolet ray like azo dye and photodimerization type photo-alignment that molecular frameworks generate a chemical bond caused by a polarized ultraviolet ray such as cinnamic acid, coumalin, and chalcone, and other types. Photodecomposition type photo-alignment is suited to the photo-alignment of polyimide that is reliable and achieves results as a liquid crystal alignment film, in which a polarized ultraviolet ray is applied to polymers, only polymer chains arranged in the polarization direction are broken and decomposed and molecular chains in the direction perpendicular to the polarization direction are left.

This method is studied in various liquid crystal display modes. For the IPS mode in the various modes, Japanese Patent Application Laid-Open No. 2004-206091 discloses a liquid crystal display device that decreases the occurrence of display failures caused by changes in the initial alignment direction, stabilizes liquid crystal alignment, and improves mass production, a contrast ratio, and image quality. In Japanese Patent Application Laid-Open No. 2004-206091, the function of controlling molecular orientations is provided by performing an alignment process in which at least one secondary treatment of heating, infrared irradiation, far infrared irradiation, electron beam irradiation, and radiation exposure is applied to polyimide or polyamic acid formed of aromatic diamine, cyclobutanetetracarboxylic dianhydride, and a derivative of cyclobutanetetracarboxylic dianhydride, polyamic acid formed of aromatic diamine and cyclobutanetetracarboxylic dianhydride, or polyamic acid formed of aromatic diamine and a derivative of cyclobutanetetracarboxylic dianhydride. It is noted that a configuration in which the alignment film is formed in a two-layer structure is described in Japanese Patent Application Laid-Open No. 2010-72011.

More specifically, Japanese Patent Application Laid-Open No. 2004-206091 describes that the effect is further effectively exerted when at least one process of heating, infrared irradiation, far infrared irradiation, electron beam irradiation, and radiation exposure is performed in a temporal overlap of a polarized light irradiation process, and that the effect is also effectively exerted when an alignment control film is subjected to an imidization baking process and the polarized light irradiation process in a temporal overlap. More specifically, Japanese Patent Application Laid-Open No. 2004-206091 describes that in the case where a liquid crystal alignment film is subjected to at least one process of heating, infrared irradiation, far infrared irradiation, electron beam irradiation, and radiation exposure in addition to polarized light irradiation, the temperature of the alignment control film is desirably in a range of a temperature of 100 to 400° C., and more desirably in a range of a temperature of 150 to 300° C. The processes of heating, infrared irradiation, and far infrared irradiation can be combined with the imidization baking process of the alignment control film, which is effective.

However, the liquid crystal display device using these photo-alignment films has a short history as compared with the case of using rubbed alignment films, and sufficient findings are not available for long-term display quality over several years as a practical liquid crystal display device. In other words, the fact is that the relationship between image quality failures and problems unique to the photo-alignment film, which are not obvious in the initial stage of manufacture, are rarely reported.

SUMMARY OF THE INVENTION

The present inventors thought that in order to implement a liquid crystal display device of high quality and high definition in future, photo-alignment techniques became important, and conducted detailed studies on problems in the application of the photo-alignment techniques to liquid crystal display devices. As a result, the following was revealed. In the previously existing photo-alignment techniques, ultraviolet rays used for photo-alignment processes are effective in producing liquid crystal alignment regulating force on the surface of the alignment film. However, ultraviolet rays also work in the inside of the film, for which a long-term structural stability is necessary, and the ultraviolet rays optically degrade the inside of the film, and decrease the mechanical strength of the film. Thus, the ultraviolet rays affect the display stability of a liquid crystal display device when vibrations, impacts, thermal strain, and the like are externally applied, leading to problems to cope with products in future.

It is an object of the present invention to provide a liquid crystal display device that can stably provide excellent display characteristics for a long time even in the case where photo-alignment techniques are used and a manufacturing method thereof.

In the present application, a brief description of a representative configuration of some aspects to be disclosed is as follows.

A liquid crystal display device includes: a TFT substrate having a pixel electrode and a TFT and formed with an alignment film on a pixel; a counter substrate disposed opposite to the TFT substrate and formed with an alignment film on a top surface on the TFT substrate side; and a liquid crystal sandwiched between the alignment film of the TFT substrate and the alignment film of the counter substrate. In the liquid crystal display device, the alignment film is configured of a first alignment film layer contacting the liquid crystal layer and having at least one kind of polyimide and a second alignment film layer formed below the first alignment film layer and having at least one kind of polyimide, the first alignment film layer is a material that is enabled to provide liquid crystal alignment regulating force by applying polarized light, and the first alignment film layer and the second alignment film layer contain a common polyimide structure.

Moreover, in the liquid crystal display device, the common polyimide structure includes a part of a repetition unit structure forming a polyimide structure contained only in the first alignment film layer and a part of a repetition unit structure forming a polyimide structure contained only in the second alignment film layer.

Furthermore, in the liquid crystal display device, the alignment film is in a state of a liquid solution uniformly dissolved in a solvent immediately before the alignment film is coated on the substrate, and a phase separation state appears in the liquid solution state by heating after the alignment film is coated on the substrate.

In addition, in the liquid crystal display device, immediately before the alignment film is coated on the substrate, the polyimide is not imidized and in a state of a liquid solution uniformly dissolved in a solvent, and a phase separation state appears in the liquid solution state by heating after the alignment film is coated on the substrate.

Moreover, in the liquid crystal display device, the common polyimide structure is present in a range of 1 to 20 wt % to the entire first alignment film layer, and the common polyimide structure is present in a range of 1 to 20 wt % to the entire second alignment film layer.

Furthermore, in the liquid crystal display device, the alignment film is a photodecomposition type photo-alignment film.

In addition, in the liquid crystal display device, the first alignment film layer is a photodecomposition type photo-alignment film containing polyimide given by Chemical formula 1, (Chemical formula 1)

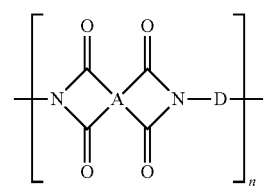

where a formula in brackets expresses a chemical structure of a repetition unit, numerical subscript n expresses a number of the repetition unit, N expresses a nitrogen atom, O expresses an oxygen atom, A expresses a quadrivalent organic group containing a cyclobutane ring, and D expresses a divalent organic group.

Moreover, in the liquid crystal display device, the alignment film has a structure in which two types of alignment films are stacked in a two-layer structure formed of a photo-alignable photo-alignment upper layer and a low resistive under layer having a resistivity lower than a resistivity of the photo-alignment upper layer. The specific resistivity of the under layer alignment film is decreased, so that it is possible to eliminate electric charges charged on the alignment film in an early stage, and it is possible to reduce an afterglow phenomenon.

Furthermore, in the liquid crystal display device, the liquid crystal display device is an IPS mode liquid crystal display device.

In addition, a manufacturing method for a liquid crystal display device is a manufacturing method for a liquid crystal display device including a TFT substrate having a pixel electrode and a TFT and formed with an alignment film on a pixel, a counter substrate disposed opposite to the TFT substrate and formed with an alignment film on a top surface on the TFT substrate side, and a liquid crystal sandwiched between the alignment film of the TFT substrate and the alignment film of the counter substrate, the method including the steps of: preparing the TFT substrate having the pixel electrode and the TFT; preparing an alignment film material containing a blend of a first polymeric material having a first solubility parameter, a second polymeric material having a second solubility parameter, and a third polymeric material having a third solubility parameter between the first solubility parameter and the second solubility parameter; subjecting a surface of the TFT substrate or the counter substrate to ozone water processing; forming an alignment film on the TFT substrate or the counter substrate using the alignment film material after the ozone water processing; applying a polarized ultraviolet ray to the alignment film to provide a state of liquid crystal alignment regulating force on a top surface layer of the alignment film; attaching the TFT substrate attached with the alignment film provided with alignment regulating force to the counter substrate; and filling a liquid crystal between the TFT substrate and the counter substrate in the attaching step or after the attaching step.

Moreover, in the manufacturing method for a liquid crystal display device, after applying the ultraviolet ray, the alignment film is oxidized.

Furthermore, in the manufacturing method for a liquid crystal display device, after the step of forming the alignment film on the TFT substrate or the counter substrate, the substrate is held at a temperature of 100 to 150° C.

Polyimide referred here is a polymer compound expressed by Chemical formula 1, where a formula in brackets expresses the chemical structure of a repetition unit, numerical subscript n expresses the number of the repetition unit, N expresses a nitrogen atom, O expresses an oxygen atom, A expresses a quadrivalent organic group containing a cyclobutane ring, and D expresses a divalent organic group. Examples of the structure of A can include: an aromatic cyclic compound such as a phenylene ring, naphthalene naphthalene ring, and anthracene ring; an aliphatic cyclic compound such as cyclobutane, cyclopentane, and cyclohexane; or a compound that a substituent group is bonded to these compounds, for example. In addition, examples of the structure of D can include: an aromatic cyclic compound such as phenylene, biphenylene, oxybiphenylene, biphenyleneamine, naphthalene, and anthracene; an aliphatic cyclic compound such as cyclohexene and bicyclohexene; or a compound that a substituent group is bonded to these compounds, for example.

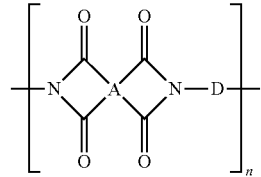

(Chemical formula 1)

These polyimides are coated on various base layers held on a substrate in a state of a polyimide precursor.

Moreover, the polyimide precursor referred here is polyamic acid or a polyamic acid ester polymer compound expressed by Chemical formula 2, where H expresses a hydrogen atom, $R_1$ and $R_2$ express hydrogen or an alkyl chain $-C_mH_{2m+1}$, and m=1 or 2.

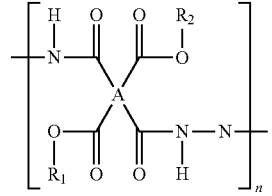

(Chemical formula 2)

In order to form such an alignment film, a thin film is formed using a typical forming method for a polyimide alignment film, for example, in which a base layer is purified using various surface treatment methods such as a UV/ozone method, excimer UV method, and oxygen plasma method, the precursor of the alignment film is coated using various printing methods such as screen printing, flexographic printing, and ink jet printing, the film is subjected to a leveling process to provide a uniform film thickness under predetermined conditions, and then the film is heated at a temperature of 180° C. or more, for example, to imidize a precursor polyamide to polyimide. In the formation, it is also possible to add various additives in advance in order to improve the wettability to the base layer and to promote the imidization reaction, for example.

In the formation, the provision of a strong polarity to the base layer is specifically effective in forming an alignment film having a plurality of types of alignment film layers like the alignment film according to an embodiment of the present invention by only a single coating step. In other words, it is possible to use the effect that the alignment film is a liquid solution uniformly mixed with polyimide structures forming a plurality of types of the alignment film layers immediately after the liquid solution is coated and the liquid solution is naturally separated into two layers based on the difference between the surface free energy to the air layer of the topmost layer and the surface free energy of the base layer in the processes of drying the solvent after the liquid solution is coated.

However, since the effect of the cleanness of the base layer is lost at a moment at which the base layer contacts the liquid solution containing the solvent, the surface free energy difference is smaller than the surface free energy difference in the state immediately before the liquid solution is coated in the midway point in which the concentration of the liquid solution becomes denser for drying the solvent. When a polar group is generated by surface treatment to provide a strong polarity on the base layer to maintain surface free energy, ozone water cleaning, for example, so that it is possible to maintain the surface free energy difference for a long time, and it is possible to keep the properties that cause the liquid solution to be naturally separated into two layers for a long time. Moreover, for such two-layer separation properties, the polyimide structures used for forming a plurality of types of alignment film layers desirably substantially have phase separation properties.

In the case where it is supposed that the liquid solution is a polyimide blend with no phase separation properties, it is not possible to efficiently separate the polymer blend into two layers even though the surface free energy difference is present between the air layer and the base layer, and specific component polymers can be induced only to near the interface contacting the air layer or the base layer. In general, for the phase separation properties, some polymer blends exhibit phase separation at a temperature lower than a critical temperature and some exhibit phase separation at a temperature higher than a critical temperature. In forming the alignment film, phase separation properties desirably appear in the processes of increasing temperature to a temperature of 180° C. or more, at which the thermal imidization reaction proceeds, after the polymer blend is coated at ambient temperature.

More desirably, it is important to select a polymer blend having phase separation properties at a high temperature at which two-layer separation properties are promoted by performing a process that the polymer blend is held at a temperature of 100 to 150° C. for certain hours before thermal imidization. Since the solvent is left too much on the substrate after the blend is coated at a temperature lower than a temperature of 100 to 150° C., the phase is a mixed phase of the polyimide precursor and the solvent. When the solvent is being dried to some extent, the phase separation properties of the polyimide precursor blend can appear. Moreover, alignment regulating force can be produced on the surface of the polyimide alignment film by applying polarized ultraviolet rays or by moderate postprocessing using desired schemes.

Two substrates attached with the alignment film thus formed are attached to each other with a certain gap maintained, and the gap portion is filled with a liquid crystal. Alternatively, a liquid crystal is dropped before the substrates are attached to each other, and then the substrates are attached to each other. After attaching the substrates, the end portions of the substrates are sealed, and a liquid crystal panel is completed. Optical films such as a polarizer and a retardation plate are attached to the panel, a drive circuit, a backlight, and other components are mounted, and then a liquid crystal display device is obtained.

According to an aspect of the present invention, it is possible to provide a high quality liquid crystal display device that achieves the mechanical strength of a photo-alignment film and has excellent long-term storage stability, viewing angle characteristics, high display contrast, and less afterglow.

BRIEF DESCRIPTION OF THE DRAWINGS

FIG. 10 is Table 1 of evaluation results obtained from the first embodiment of the present invention;

FIG. 11 is Table 2 of evaluation results obtained from a second embodiment of the present invention;

FIG. 12 is Table 3 of evaluation results obtained from a third embodiment of the present invention;

FIG. 13 is Table 4 of temporary drying conditions; and

FIG. 14 is Table 5 of evaluation results obtained from a fourth embodiment of the present invention.

DETAILED DESCRIPTION OF THE PREFERRED EMBODIMENTS

Figure 1A:
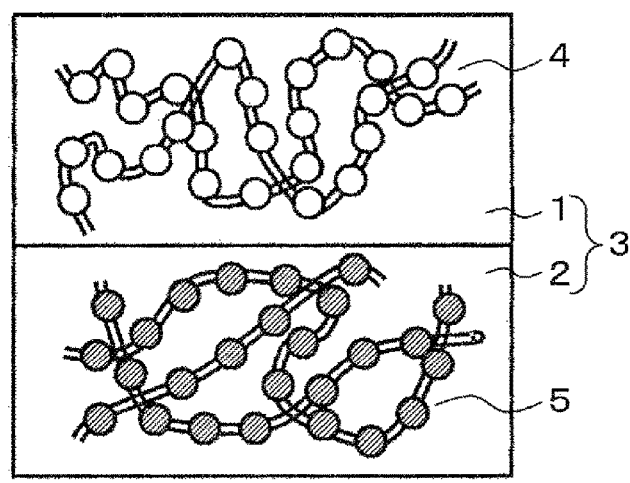
FIG. 1A is a schematic cross sectional view of an alignment film in a previously existing two-layer structure.

In the following, the present invention will be described in detail with reference to embodiments and the drawings. It is noted that in all the drawings for explaining the embodiments, components having the same functions are designated the same reference numerals and signs, and the overlapping description will be omitted.

Figure 1B:
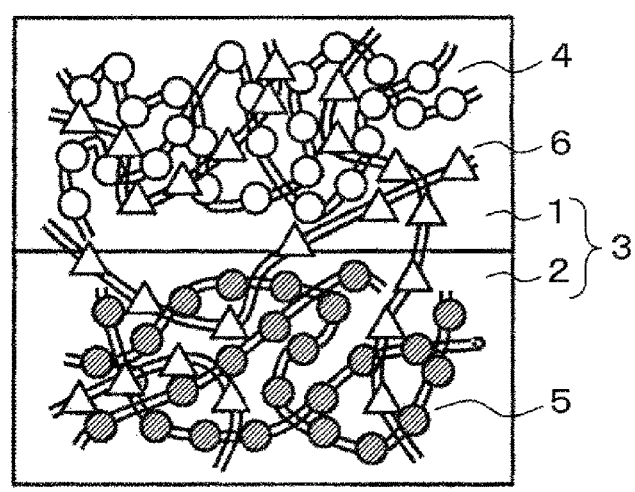
FIG. 1B is a schematic cross sectional view of an alignment film in a two-layer structure according to an embodiment of the present invention.

FIG. 1A is a schematic cross sectional view of an alignment film in a two-layer structure of a previously existing liquid crystal display device, and FIG. 1B is a schematic cross sectional view of an alignment film in a two-layer structure of a liquid crystal display device according to an embodiment of the present invention. As illustrated in FIG. 1A, in the previously existing liquid crystal display device including an alignment film 3 configured of a first alignment film layer 1 and a second alignment film layer 2 formed below the first alignment film layer 1, component polymers 4 for the first alignment film layer 1 are present in the first alignment film layer 1, and component polymers 5 for the second alignment film layer 2 are present in the second alignment film layer 2.

Such a photo-alignment film in a two-layer structure is described in Japanese Patent Application Laid-Open No.

2010-72011, for example, and the following is described. In this photo-alignment film, a two-component material is subjected to phase separation to form an alignment film in a two-layer structure, photo-alignment components of high alignment stability are disposed on the liquid crystal layer side, and low resistance components that alignment stability is unnecessary are disposed on the substrate side. Thus, it is possible to satisfy both of alignment stability and a decrease in the time constant of DC afterglow caused by the low resistant alignment film at the same time, and as a result, the afterglow characteristics of the photo-alignment film are greatly improved.

However, the improved photo-alignment properties are accompanied by a photoreaction at the portion of the improved photo-alignment properties. More specifically, in a photodecomposition type photo-alignment film material, an alignment film layer of improved photo-alignment properties inevitably becomes an alignment film with weak mechanical strength because the chemical structure at the portion is broken. Therefore, as illustrated in FIG. 1B, in an embodiment of the present invention, component polymers 6 present in common to both of a first alignment film layer 1 and a second alignment film layer 2 are introduced. The presence of such common components allows the reinforcement of the mechanical strength of the first alignment film layer 1 and decreases the interfacial peeling between the first alignment film layer 1 and the second alignment film layer 2.

Figure 2:
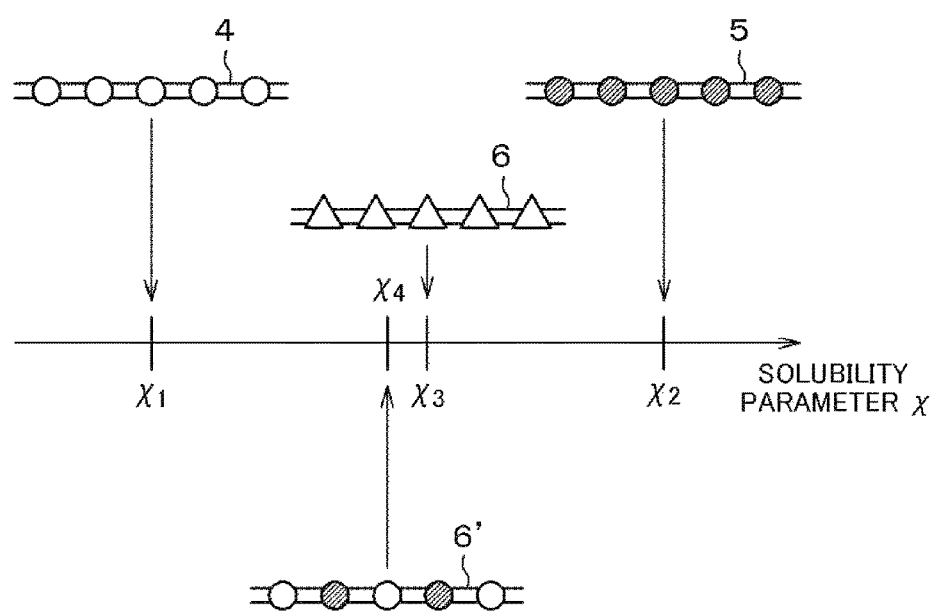
FIG. 2 is a schematic diagram of photo-alignment processes for an alignment film of a liquid crystal display device according to an embodiment of the present invention.

As illustrated in FIG. 2, the compatibility of a blend of such heterogeneous polymers can be sorted according to solubility parameters X of the polymers. (Here, the molecular weights of the polymers are considered to be all the same for simplification.) Here, it is supposed that the solubility parameter of the component polymer 4 of the first alignment film layer is defined as $X_1$ and the solubility parameter of the component polymer 5 of the second alignment film layer is defined as $X_2$, and then a polymer blend having a poorer mutual solubility (phase separation is easier) has a greater difference between $X_1$ and $X_2$. Therefore, the common component polymer 6 having solubility to both of the alignment film layers is necessary to have a solubility parameter $X_3$ between $X_1$ and $X_2$. It is necessary to provide a molecule design that searches for the common component polymer 6 having such an intermediate solubility parameter. There is a simple method in which repetition units forming the component polymer 4 and the component polymer 5 (in FIG. 2, the units are simply denoted as while circles and dark circles) are randomly mixed to combine a component polymer 6' and the component polymer 6' has an intermediate solubility parameter $X_4$. In such a three-component system, the component polymer 4 and the component polymer 5 do not have compatibility, whereas the component polymer 6' common to the component polymer 4 and the component polymer 5 has solubility to these polymers. However, the component polymer 6' common to the component polymer 4 and the component polymer 5 in an equal ratio is not always dissolved, and is contained in ratios of components in phases formed by the individual components. Such an alignment film can be assembled in a liquid crystal display device by typical methods.

Figure 3A:
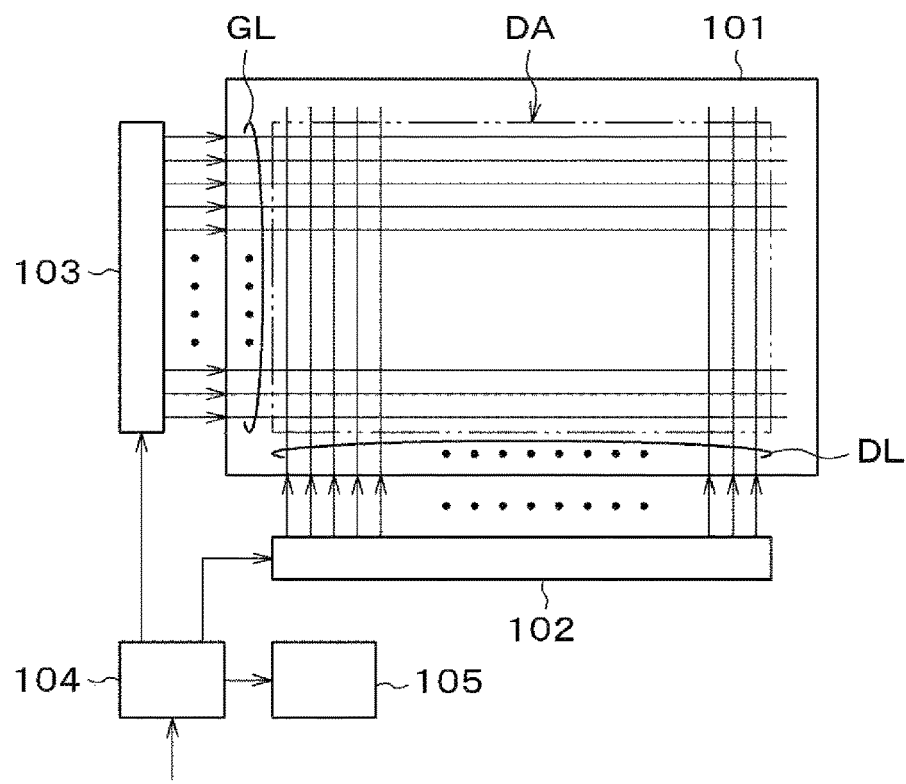
FIG. 3A is a schematic block diagram of an exemplary schematic configuration of a liquid crystal display device according to an embodiment of the present invention.
Figure 3B:
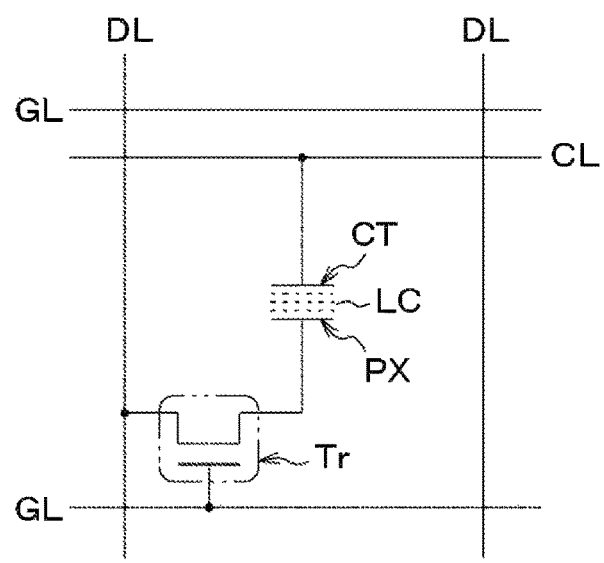
FIG. 3B is a schematic circuit diagram of an exemplary circuit configuration of a single pixel of a liquid crystal display panel.
Figure 3C:
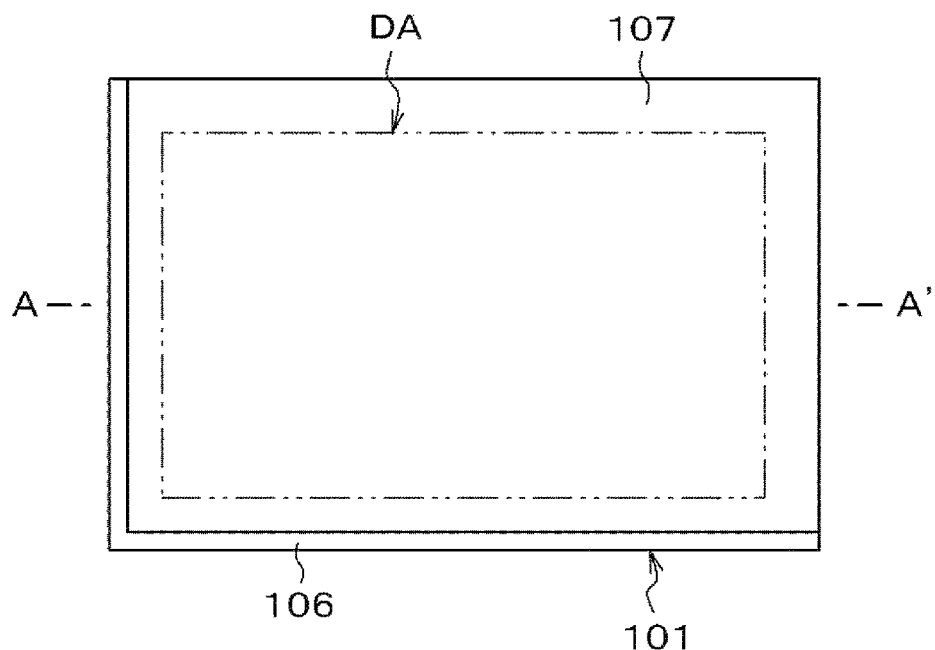
FIG. 3C is a schematic plan view of an exemplary schematic configuration of the liquid crystal display panel.
Figure 3D:
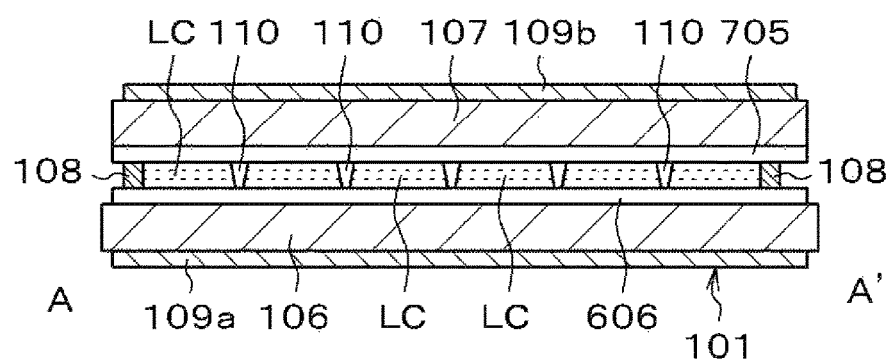
FIG. 3D is a cross sectional view of an exemplary cross sectional configuration taken along line A-A' in FIG. 3C.

Next, a liquid crystal display device on which the alignment film is prepared will be described. FIGS. 3A to 3D are schematic diagrams of an exemplary schematic configuration of a liquid crystal display device according to the embodiment of the present invention. FIG. 3A is a schematic block diagram of an exemplary schematic configuration of the liquid crystal display device. FIG. 3B is a schematic circuit diagram of an exemplary circuit configuration of a single pixel of a liquid crystal display panel. FIG. 3C is a schematic plan view of an exemplary schematic configuration of the liquid crystal display panel. FIG. 3D is a cross sectional view of an exemplary cross sectional configuration taken along line A-A' in FIG. 3C.

The alignment film according to the embodiment of the present invention is adapted to an active matrix liquid crystal display device, for example. The active matrix liquid crystal display device is used for a display (a monitor) intended for a mobile electronic device, a display for a personal computer, a display intended for printing and design, a display for a medical device, and a liquid crystal television, for example.

As illustrated in FIG. 3A, the active matrix liquid crystal display device has, for example, a liquid crystal display panel 101, a first drive circuit 102, a second drive circuit 103, a control circuit 104, and a backlight 105.

The liquid crystal display panel 101 has a plurality of scanning signal lines GL (gate lines) and a plurality of picture signal lines DL (drain lines). The picture signal line DL is connected to the first drive circuit 102, and the scanning signal line GL is connected to the second drive circuit 103. It is noted that in FIG. 3A, a plurality of the scanning signal lines GL is partially illustrated, and on the actual liquid crystal display panel 101, a larger number of the scanning signal lines GL are closely disposed. Similarly, in FIG. 3A, a plurality of the picture signal lines DL is partially illustrated, and on the actual liquid crystal display panel 101, a larger number of the picture signal lines DL are closely disposed.

Moreover, a display region DA of the liquid crystal display panel 101 is configured of a group of a large number of pixels. A region occupied by a single pixel on the display region DA corresponds to a region surrounded by two adjacent scanning signal lines GL and two adjacent picture signal lines DL, for example. In this case, the circuit configuration of a single pixel is a configuration as illustrated in FIG. 3B, for example, and the pixel includes a TFT element Tr that functions as an active element, a pixel electrode PX, a common electrode CT (sometimes referred to as a counter electrode), and a liquid crystal layer LC. Furthermore, in this case, the liquid crystal display panel 101 is provided with a common interconnection CL that provides commonality of the common electrodes CT of a plurality of the pixels, for example.

In addition, as illustrated in FIGS. 3C and 3D, for example, the liquid crystal display panel 101 has a structure in which alignment films 606 and 705 are formed on the surfaces of an active matrix substrate (a TFT substrate) 106 and a counter substrate 107, respectively, and the liquid crystal layer LC (a liquid crystal material) is disposed between the alignment films. Moreover, not specifically illustrated in the drawings here, it may be fine to appropriately provide an intermediate layer (an optical intermediate layer including a retardation plate, a color conversion layer, and a light diffusion layer, for example) between the alignment film 606 and the active matrix substrate 106 or between the alignment film 705 and the counter substrate 107.

In this case, the active matrix substrate 106 is attached to the counter substrate 107 with an annular sealing material 108 provided on the outer side of the display region DA, and the liquid crystal layer LC is encapsulated in a space surrounded by the alignment film 606 on the active matrix substrate 106 side, the alignment film 705 on the counter substrate 107 side, and the sealing material 108. Furthermore, in this case, the liquid crystal display panel 101 of the liquid crystal display device having the backlight 105 includes a pair of polarizers 109a and 109b oppositely disposed as the active matrix substrate 106, the liquid crystal layer LC, and the counter substrate 107 are sandwiched.

It is noted that the active matrix substrate 106 is a substrate on which the scanning signal lines GL, the picture signal lines DL, the active elements (the TFT elements Tr), the pixel electrodes PX, and the like are disposed on an insulating substrate such as a glass substrate. Moreover, in the case where the driving method for the liquid crystal display panel 101 is a transverse electric field drive mode such as the IPS mode, the common electrode CT and the common interconnection CL are disposed on the active matrix substrate 106. Furthermore, in the case where the driving method for the liquid crystal display panel 101 is a vertical electric field drive mode such as the TN mode and the VA (Vertical Alignment) mode, the common electrode CT is disposed on the counter substrate 107. In the case of the liquid crystal display panel 101 in the vertical electric field drive mode, the common electrode CT is typically a large area plate electrode shared by all the pixels, and the common interconnection CL is not provided.

Furthermore, in the liquid crystal display device according to the embodiment of the present invention, a plurality of columnar spacers 110 is provided in the space, in which the liquid crystal layer LC is encapsulated, to uniformize the thickness of the liquid crystal layer LC (sometimes referred to as a cell gap) in the pixels, for example. The plurality of the columnar spacers 110 is provided on the counter substrate 107, for example.

The first drive circuit 102 is a drive circuit that generates a picture signal (sometimes referred to as a gray scale voltage) applied to the pixel electrodes PX of the pixels through the picture signal lines DL, and is a drive circuit generally called a source driver and a data drive, for example. Moreover, the second drive circuit 103 is a drive circuit that generates scanning signals applied to the scanning signal lines GL, and is a drive circuit generally called a gate driver and a scan driver, for example. Furthermore, the control circuit 104 is a circuit that controls the operation of the first drive circuit 102, the operation of the second drive circuit 103, and the brightness of the backlight 105, for example, and is a control circuit generally called a TFT controller and a timing controller, for example. In addition, the backlight 105 is a fluorescent lamp including a cold cathode fluorescent lamp or a light source including a light emitting diode (LED), for example. Light emitted from the backlight 105 is converted into planar rays through a reflector, a light guide plate, a light diffuser, a prism sheet, and the like, not illustrated, and applied to the liquid crystal display panel 101.

Figure 4:
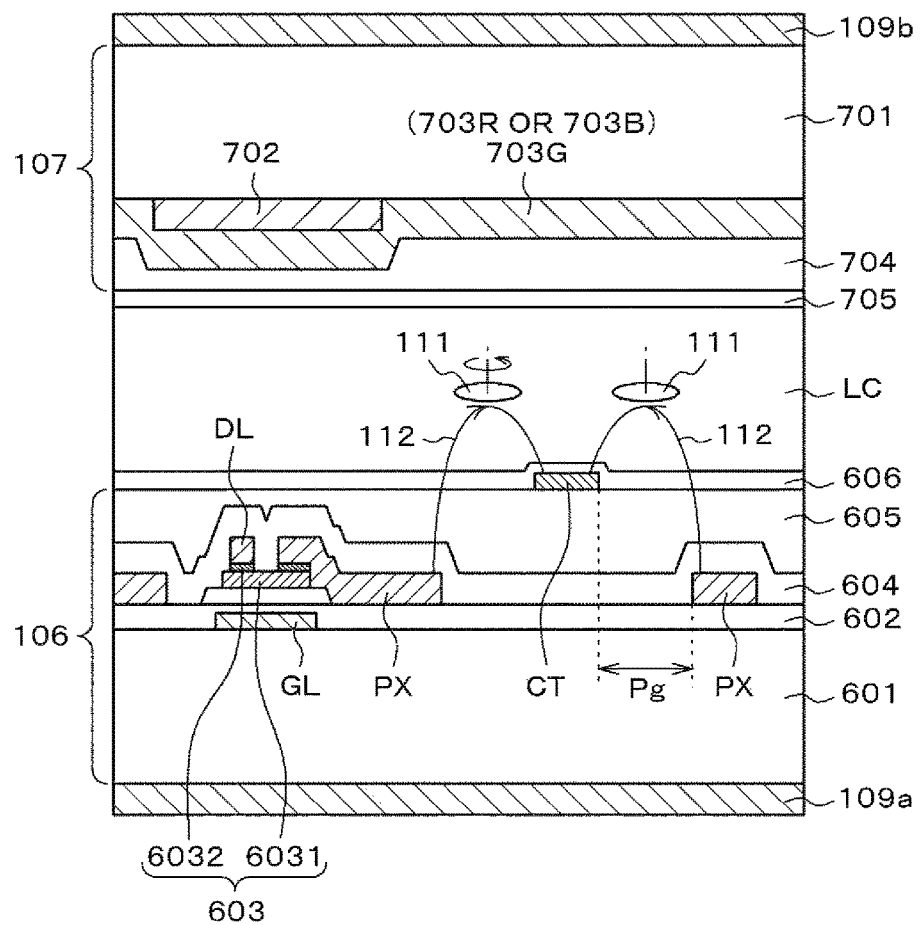
FIG. 4 is a schematic diagram of an exemplary schematic configuration of an IPS mode liquid crystal display panel according to an embodiment of the present invention.

FIG. 4 is a schematic diagram of an exemplary schematic configuration of an IPS mode liquid crystal display panel of the liquid crystal display device according to the embodiment of the present invention. An active matrix substrate 106 includes a scanning signal line GL, a common interconnection CL not illustrated in FIG. 4, and a first insulating layer 602 that covers these components formed on the surface of an insulating substrate such as a glass substrate 601. On the first insulating layer 602, a semiconductor layer 603 of a TFT element Tr, a picture signal line DL, a pixel electrode PX, and a second insulating layer 604 that covers these components are formed. The semiconductor layer 603 is disposed on the scanning signal line GL, and the portion of the scanning signal line GL located on the lower part of the semiconductor layer 603 functions as the gate electrode of the TFT element Tr.

Moreover, the semiconductor layer 603 is in a configuration in which, for example, an active layer 6031 (a channel forming layer) is formed of first amorphous silicon and a source diffusion layer and a drain diffusion layer formed of second amorphous silicon 6032 having an impurity type and concentration different from the first amorphous silicon are stacked on the active layer. Furthermore, in this configuration, a part of the picture signal line DL and a part of the pixel electrode PX are on the semiconductor layer 603, and the portions on the semiconductor layer 603 function as the drain electrode and source electrode of the TFT element Tr.

The source and drain of the TFT element Tr are switched to each other depending on the relationship of biases, that is, the relationship between the levels of the potential of the pixel electrode PX and the potential of the picture signal line DL when the TFT element Tr is turned on. However, in the following description of the embodiment of the present specification, the electrode connected to the picture signal line DL is referred to as a drain electrode, and the electrode connected to the pixel electrode is referred to as a source electrode. On the second insulating layer 604, a third insulating layer 605 (an organic passivation film) whose surface is planarized is formed. On the third insulating layer 605, a common electrode CT and an alignment film 606 that covers the common electrode CT and the third insulating layer 605 are formed.

The common electrode CT is connected to the common interconnection CL through a contact hole (a through hole) that penetrates the first insulating layer 602, the second insulating layer 604, and the third insulating layer 605. Moreover, the common electrode CT is formed in such a manner that a gap Pg to the pixel electrode PX on a plane is about 7 μm, for example. The alignment film 606 is coated with a polymeric material described in embodiments below, the surface is subjected to surface treatment (a photo-alignment process) and an oxidation process for providing the liquid crystal aligning function, and the oxygen atom ratio on the surface of the alignment film is improved in the state in which the hydrophobic property is maintained.

On the other hand, a counter substrate 107 is formed with a black matrix 702 and color filters (703R, 703G, and 703B), and an overcoat layer 704 that covers these components on the surface of an insulating substrate such as a glass substrate 701. The black matrix 702 is a grid-like light shielding film for providing opening regions on a display region DA in units of the pixels, for example. Moreover, the color filters (703R, 703G, and 703B) are films that transmit only certain rays in specific wavelength regions (colors) in white light emitted from a backlight 105, for example. In the case where the liquid crystal display device is adapted to color display in the RGB mode, these color filters are disposed: the color filter 703R that transmits red light; the color filter 703G that transmits green light; and the color filter 703B that transmits blue light. Here, the pixel in one color is illustrated for a representing one.

Moreover, the surface of the overcoat layer 704 is planarized. On the overcoat layer 704, a plurality of columnar spacers 110 and an alignment film 705 are formed. The columnar spacer 110 is a circular truncated cone with a flat top (sometimes referred to as a trapezoid rotator), for example, and is formed at a position on the scanning signal line GL of the active matrix substrate 106 except a portion at which the TFT element Tr is disposed and a portion at which the picture signal line DL is crossed. Furthermore, the alignment film 705 is formed of a polyimide based resin, for example. The surface is subjected to surface treatment (a photo-alignment process) and an oxidation process for providing the liquid crystal aligning function, and the oxygen atom ratio on the surface of the alignment film is improved in the state in which the hydrophobic property is maintained.

In addition, liquid crystal molecules 111 in a liquid crystal layer LC of a liquid crystal display panel 101 in the mode in FIG. 4 are in the state in which the liquid crystal molecules 111 are aligned nearly in parallel with the surfaces of the glass substrates 601 and 701 when an electric field that the potentials of the pixel electrode PX and the common electrode CT are equal is not applied, and the liquid crystal molecules 111 are in homogeneous alignment in the state in which the liquid crystal molecules 111 are oriented to the initial alignment direction defined by the alignment regulating force process applied to the alignment films 606 and 705. When the TFT element Tr is turned on, a gray scale voltage applied to the picture signal line DL is written to the pixel electrode PX, and then a potential difference is produced between the pixel electrode PX and the common electrode CT, an electric field 112 (an electric flux line) illustrated in FIG. 4 is produced, and the electric field 112 whose strength corresponds to the potential difference between the pixel electrode PX and the common electrode CT is applied to the liquid crystal molecules 111.

In the application, the interaction between the dielectric anisotropy of the liquid crystal layer LC and the electric field 112 changes the orientations of the liquid crystal molecules 111 forming the liquid crystal layer LC in the direction of the electric field 112, and the refractive anisotropy of the liquid crystal layer LC is changed. Moreover, in the application, the orientations of the liquid crystal molecules 111 are determined by the strength of the electric field 112 to be applied (the size of the potential difference between the pixel electrode PX and the common electrode CT). Thus, in the liquid crystal display device, the potential of the common electrode CT is fixed, and the gray scale voltage applied to the pixel electrode PX is controlled for the individual pixels to change the transmittances of the pixels, so that pictures and images can be displayed, for example.

Figure 5:
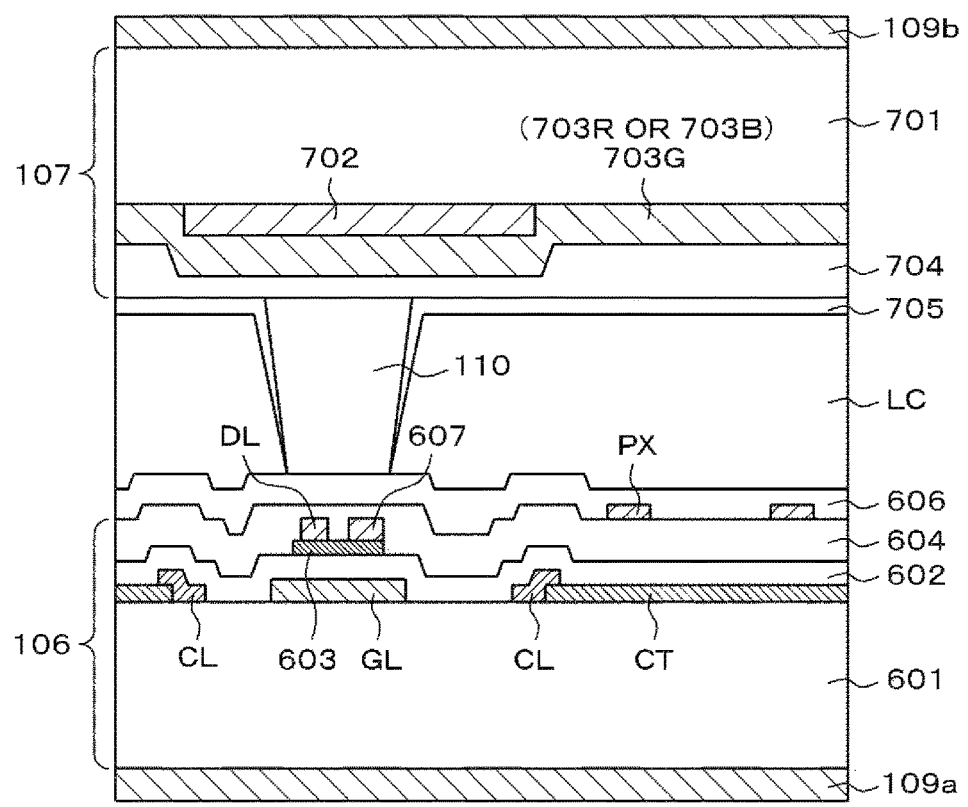
FIG. 5 is a schematic diagram of an exemplary schematic configuration of an FFS mode liquid crystal display panel according to an embodiment of the present invention.

FIG. 5 is a schematic diagram of an exemplary schematic configuration of an FFS mode liquid crystal display panel of another liquid crystal display device according to the embodiment of the present invention. An active matrix substrate 106 is formed with a common electrode CT, a scanning signal line GL, a common interconnection CL, and a first insulating layer 602 that covers these components on the surface of an insulating substrate such as a glass substrate 601. On the first insulating layer 602, a semiconductor layer 603 of a TFT element Tr, a picture signal line DL, and a source electrode 607, and a second insulating layer 604 that covers these components are formed. In this case, a part of the picture signal line DL and a part of the source electrode 607 are on the semiconductor layer 603, and the portions on the semiconductor layer 603 function as the drain electrode and the source electrode of the TFT element Tr.

Moreover, in a liquid crystal display panel 101 in FIG. 5, the third insulating layer 605 is not formed, and a pixel electrode PX and an alignment film 606 that covers the pixel electrode PX are formed on the second insulating layer 604. Although not illustrated in FIG. 5, the pixel electrode PX is connected to the source electrode 607 through a contact hole (a through hole) that penetrates the second insulating layer 604. In this case, the common electrode CT formed on the surface of the glass substrate 601 is formed in a flat plate shape on a region (an opening region) surrounded by two adjacent scanning signal lines GL and two adjacent picture signal lines DL, and the pixel electrode PX having a plurality of slits is stacked on the common electrode CT in a flat plate shape. Furthermore, in this case, the common electrode CT of the pixels arranged in the extending direction of the scanning signal line GL is shared by the common interconnection CL. On the other hand, a counter substrate 107 of the liquid crystal display panel 101 in FIG. 5 has the same configuration as the configuration of the counter substrate 107 of the liquid crystal display panel 101 in FIG. 4. Thus, the detailed description of the configuration of the counter substrate 107 is omitted.

Figure 6:
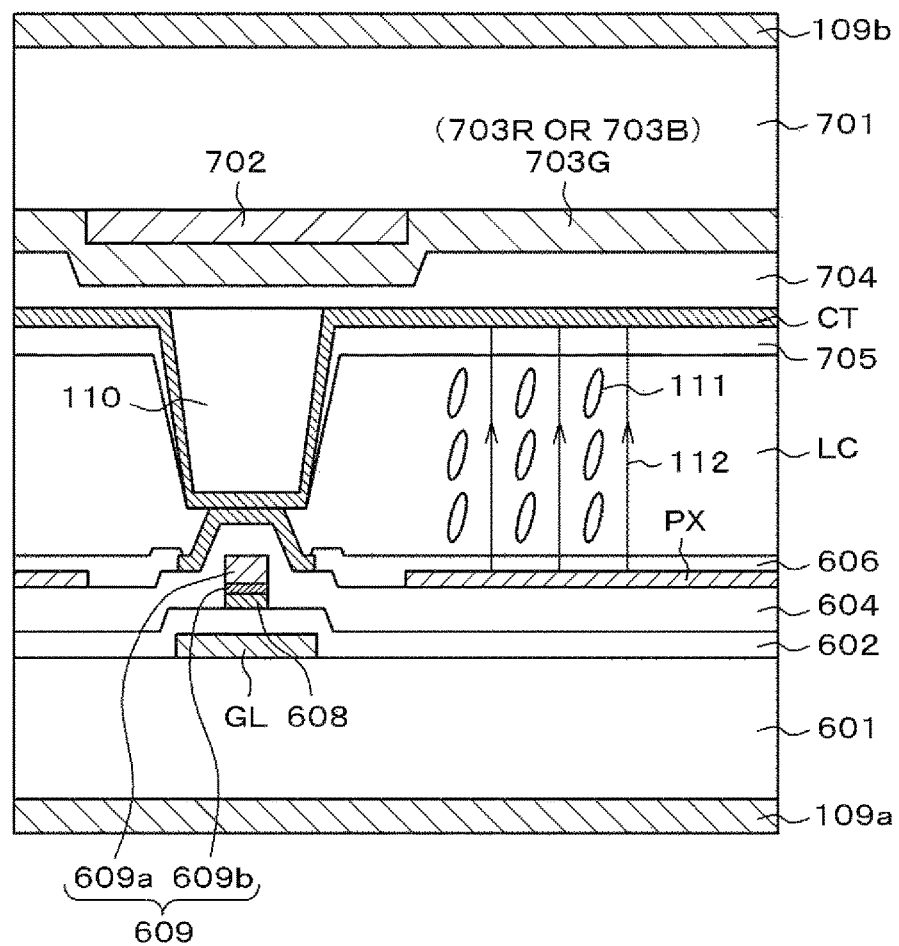
FIG. 6 is a schematic diagram of an exemplary schematic configuration of a VA mode liquid crystal display panel according to an embodiment of the present invention.

FIG. 6 is a cross sectional view of an exemplary cross sectional configuration of the main components of a VA mode liquid crystal display panel of still another liquid crystal display device according to the embodiment of the present invention. As illustrated in FIG. 6, in a liquid crystal display panel 101 in the vertical electric field drive mode, a pixel electrode PX is formed on an active matrix substrate 106, for example, and a common electrode CT is formed on a counter substrate 107. In the case of the VA mode liquid crystal display panel 101, which is one of vertical electric field drive modes, the pixel electrode PX and the common electrode CT are formed in a solidly filled shape (a simple flat shape) with a transparent conductor such as ITO.

In this case, liquid crystal molecules 111 are vertically aligned to the surfaces of the glass substrates 601 and 701 caused by alignment films 606 and 705 when an electric field that the potentials of the pixel electrode PX and the common electrode CT are equal is not applied. When a potential difference is produced between the pixel electrode PX and the common electrode CT, an electric field 112 (an electric flux line) almost perpendicular to the glass substrates 601 and 701 is produced, the liquid crystal molecules 111 are laid in the direction in parallel with the substrates 601 and 701, and the polarization state of incident light is changed. Moreover, in this case, the orientations of the liquid crystal molecules 111 are determined according to the strength of the electric field 112 to be applied.

Thus, in the liquid crystal display device, pictures and images are displayed in which, for example, the potential of the common electrode CT is fixed and a picture signal (a gray scale voltage) applied to the pixel electrode PX is controlled for the individual pixels to change the transmittances of the pixels. Moreover, various configurations are known for the configuration of the pixel of the VA mode liquid crystal display panel 101, for the planner shape of the TFT element Tr and the pixel electrode PX, for example. It may be fine that the configuration of the pixel of the VA mode liquid crystal display panel 101 illustrated in FIG. 6 is any one of these configurations. Here, the detailed description of the configuration of the pixel of the liquid crystal display panel 101 is omitted. It is noted that a reference numeral 608 denotes a conductive layer, a reference numeral 609 denotes a projection forming member, a reference numeral 609a denotes a semiconductor layer, and a reference numeral 609b denotes a conductive layer.

The embodiment of the present invention relates to the liquid crystal display panels 101 in the active matrix liquid crystal display devices as decried above, and specifically to the configurations of the portions contacting the liquid crystal layer LC on the active matrix substrate 106 and the counter substrate 107 and components around the contacting portions. Thus, the detailed description of the configurations of the first drive circuit 102, the second drive circuit 103, the control circuit 104, and the backlight 105, to which previously existing techniques can be applied as they are, is omitted.

Figure 7:
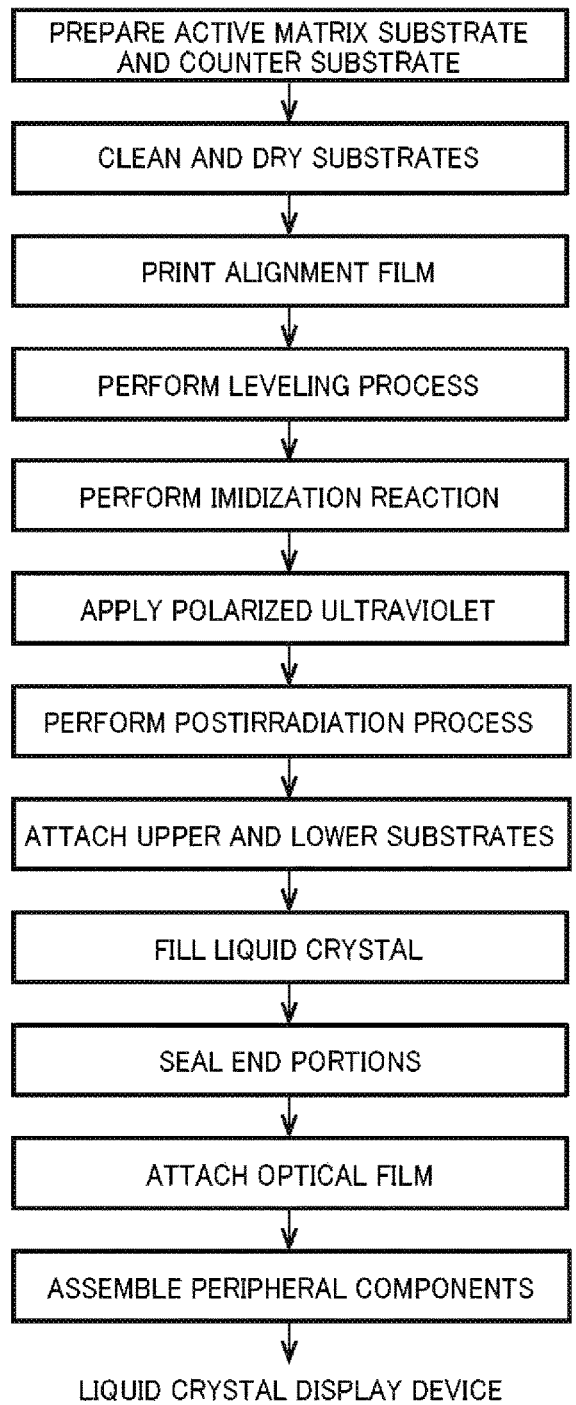
FIG. 7 is a flowchart of the manufacturing process steps of a liquid crystal display device using an alignment film according to an embodiment of the present invention.

In order to manufacture these liquid crystal display devices, various alignment film materials, various alignment methods, various liquid crystal materials, and the like, which are already used for liquid crystal display devices, can be used, and various processes for assembling and processing these materials can also be adapted. FIG. 7 is an example of processes. First, an active matrix substrate and a counter substrate are prepared through manufacture processes for the substrates, and the surfaces of base layers on which alignment films are formed are cleaned using various surface treatment methods such as a UV/ozone method, excimer UV method, and oxygen plasma method.

Subsequently, the precursor of the alignment film is coated using various printing methods such as screen printing, flexographic printing, and ink jet printing. The film is subjected to a leveling process to provide a uniform film thickness under predetermined conditions, and then the film is heated at a temperature of 180° C. or more, for example, to imidize a precursor polyamide to polyimide. Moreover, alignment regulating force is produced on the surface of the polyimide alignment film by applying polarized ultraviolet rays or by moderate postprocessing using desired schemes (photo-alignment). It is also possible to apply heating or light at another wavelength to the film in the stage of the polarized ultraviolet irradiation or the postirradiation process. Furthermore, in any one stage before or after the polarized ultraviolet irradiation, the surface treatment processes as described above are applied, and a photo-alignment film is formed that liquid crystal alignment regulating force on the surface is high and optical anisotropy is not observed on the entire film.

The active matrix substrate and the counter substrate attached with the alignment film thus formed are attached to each other with a certain gap maintained as the direction of the alignment regulating force is in the desired orientation. After that, the gap maintained is filled with a liquid crystal, the end portions of the substrates are sealed, and a liquid crystal panel is completed. To the panel, optical films such as a polarizer and a retardation plate are attached, a drive circuit, a backlight, and other components are mounted, and a liquid crystal display device is obtained. It is noted that in the description above, both of the alignment film formed on the active matrix substrate (the TFT substrate) and the alignment film formed on the counter substrate (the CF substrate) are exposed to an oxidizing atmosphere. However, even though any one of the alignment films is exposed, the effect of improving afterglow characteristics can be obtained. However, it is without saying that the alignment films are subjected to the surface treatment to further improve the afterglow characteristics.

Next, an exemplary confirming method will be described in which the obtained photo-alignment film is a film having desired characteristics and the liquid crystal display device obtained by mounting the film is a device having desired characteristics. First, the anchoring force of the liquid crystal that expresses the level of alignment regulating force can be measured by a method below. In other words, an alignment film is coated on a pair of two glass substrates, and subjected to the photo-alignment process. The alignment directions of these two alignment films are in parallel with each other, spacers having a suited thickness d are disposed, and an evaluation homogeneous alignment liquid crystal cell is prepared. The cell is filled with a nematic liquid crystal material containing a chiral agent of known material properties (a helical pitch is p and an elastic constant is $K_2$). After the evaluation cell is temporarily held in an isotropic phase in order to stabilize the orientation, the temperature is returned to an ambient temperature, and then a twist angle $\varphi_2$ is measured by a method below.

Subsequently, most of the liquid crystal in the cell is removed using the pressure of air or centrifugal force, and the inside of the cell is cleaned using a solvent and then dried. The cell is filled with a nematic liquid crystal material containing the same liquid crystal and not containing a chiral agent, the orientation is similarly stabilized, and then a twist angle $\varphi_1$ is measured. In the measurement, the anchoring strength is given by Equation 1.

$$A_\phi = \frac{2K_2(2\pi d/p - \phi_2)}{d\sin(\phi_2 - \phi_1)} \quad \text{(Equation 1)}$$

Figure 8:
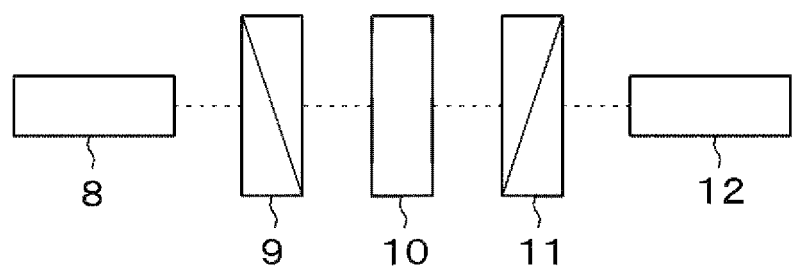
FIG. 8 is a schematic diagram of an optical system for measurement of a twist angle.

Moreover, the twist angles were measured using an optical system as illustrated in FIG. 8. In other words, a visible light source 8 and a photomultiplier tube 12 are collimated on the same straight line, and a polarizer 9, an evaluation cell 10, and an analyzer 11 are disposed in this order between the visible light source 8 and the photomultiplier tube 12. A tungsten lamp is used for the visible light source 8. First, the transmission axis of the polarizer 9 and the absorption axis of the analyzer 11 are disposed nearly in parallel with the alignment directions of the alignment films of the evaluation cell 10. Subsequently, only the polarizer is rotated, and the angle is changed in such a manner that the intensity of transmitted light becomes the smallest.

Subsequently, only the analyzer is rotated, and the angle is changed in such a manner that the intensity of transmitted light becomes the smallest. The rotation of only the polarizer and the rotation of only the analyzer are similarly repeated, and the rotations are repeated until angles become constant. A transmission axis rotation angle $\varphi_{polarizer}$ and an absorption axis rotation angle $\varphi_{analyzer}$ at a point in time when convergence is finally achieved are defined as twist angle $\varphi$=angle $\varphi_{analyzer}$–angle $\varphi_{polarizer}$.

Here, measurement errors can be decreased by adjusting a refractive index anisotropy $\Delta n$ of the liquid crystal and the thickness d of the liquid crystal cell for use.

Next, the mechanical strength of the obtained photo-alignment film was measured by 90 degree peel strength measurement below. In other words, a 100 mm by 100 mm square blank glass substrate was prepared, the glass surface was subjected to a predetermined surface purification process, the precursor liquid solution of the alignment film was coated, temporarily dried, and subjected to a thermal imidization reaction, and then the first peel strength test was performed (the film strength at this time is considered to be initial film strength). After the test, polarized ultraviolet rays were applied to the substrate, and subjected to a predetermined heat treatment and the like, and then peel strength tests were conducted on samples after being subjected to the processes (film strength at this time is referred to as posttest strength). Changes in the film strength after the samples were subjected to the processes were expressed by relative film strength (a value that the posttest strength/the initial strength was expressed by percentage). It is noted that these tests were performed after the samples were allowed to stand in a stationary environmental chamber at an ambient temperature of 23° C. and a humidity of 30% for 24 hours, and measurements were performed in the same environmental chamber.

Next, a luminance relaxation constant can be measured by a method below. Various liquid crystal display devices including the alignment films are prepared by the procedures as described in detail above. A black-and-white window pattern is continuously displayed on the liquid crystal display devices for a predetermined period (this is referred to as screen burn time), the voltage is immediately switched to a gray level display voltage that the entire screen is in a halftone, and the time for which the window pattern (also referred to as burn-in or afterglow) disappears is measured.

Ideally in the alignment film, because residual electric charges are not produced in any portions of the liquid crystal display device and the direction of the alignment regulating force is not disturbed as well, the gray level display is shown on the entire screen immediately after switching the display voltage. However, the effective orientation state is shifted from the ideal level in bright regions (white pattern portions) caused by the production of residual electric charges and the disturbance of the direction of the alignment regulating force, for example, in association with driving, and brightness is viewed differently. After the halftone display voltage is further maintained for a long time, residual electric charges and the direction of the alignment regulating force become stable at this voltage, and then uniform display is observed. The in-plane luminance distribution of the liquid crystal display device was measured using a CCD camera, a period until which uniform display was observed was defined as burn-in time, and the burn-in time was defined as the luminance relaxation constant of the liquid crystal display device. However, in the case where the display was not relaxed after a lapse of 480 hours, evaluation was stopped, and the notation≥480 was written.

Figure 9:
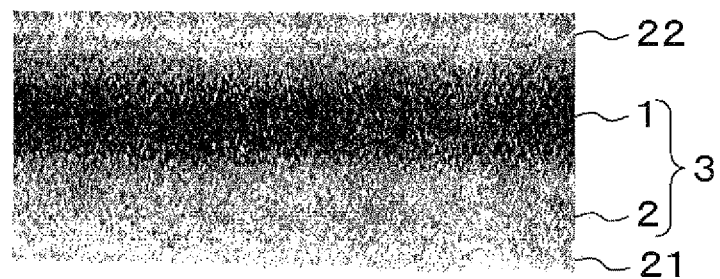
FIG. 9 is an SEM photograph of an alignment film according to a first embodiment.

Next, it was confirmed whether the obtained photo-alignment film was in a stacked structure of the first alignment film layer and the second alignment film layer formed below the first alignment film layer by a method below. The photo-alignment film formed on the blank glass substrate by a predetermined method was cut together with the substrate, the films were finished to have a flat film cross section by FIB (Focused Ion Beam) etching, immersed in 1 mol/little of a silver nitrate aqueous solution for 24 hours, and then washed with water, and then the alignment film cross sections were observed through an SEM (Scanning Electron Microscope). FIG. 9 is the SEM image of the cross section.

For an example of the SEM image, a cross sectional SEM image of sample 1-3 is shown from samples in Table 1 in FIG. 10 in a first embodiment. An alignment film 3 is formed on a substrate 21, a second alignment film layer 2 and a first alignment film layer 1 are formed from the substrate side. The second alignment film layer 2 is imaged in contrast brighter than the first alignment film layer 1. A coating layer 22 is provided on the first alignment film layer 1 for an antistatic layer for the sample in SEM observation.

In the following, the present invention will be described in more detail with reference to embodiments. The technical scope of the present invention will not be limited to the embodiments below.

First Embodiment

First, a result of preparing a liquid crystal display device will be described with reference to the drawings and tables, the liquid crystal display device including: a TFT substrate having a pixel electrode and a TFT and formed with an alignment film on a pixel; a counter substrate disposed opposite to the TFT substrate and formed with an alignment film on a top surface on the TFT substrate side; and a liquid crystal sandwiched between the alignment film of the TFT substrate and the alignment film of the counter substrate. In the liquid crystal display device, the alignment film is configured of a first alignment film layer contacting the liquid crystal layer and having at least one kind of polyimide and a second alignment film layer formed below the first alignment film layer and having at least one kind of polyimide, the first alignment film layer is a material that is enabled to provide liquid crystal alignment regulating force by applying polarized light, and the first alignment film layer and the second alignment film layer contain a common polyimide structure.

Alignment films below were used for test alignment films. First, for a polyimide precursor to be the component polymer 4 of the first alignment film layer, a chemical structure expressed by Chemical formula 3 was selected from a molecular framework expressed by Chemical formula 2, and a polyamic acid to be a raw material was composed from acid dianhydride and diamine according to an existing chemical synthesis method.

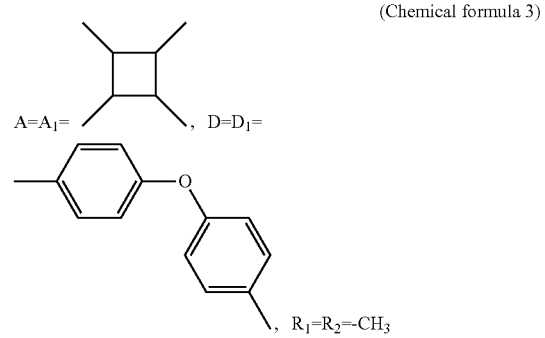

(Chemical formula 3)

Moreover, for a polyimide precursor to be the component polymer 5 of the second alignment film layer, a chemical structure expressed by Chemical formula 4 was selected from a molecular framework expressed by Chemical formula 2.

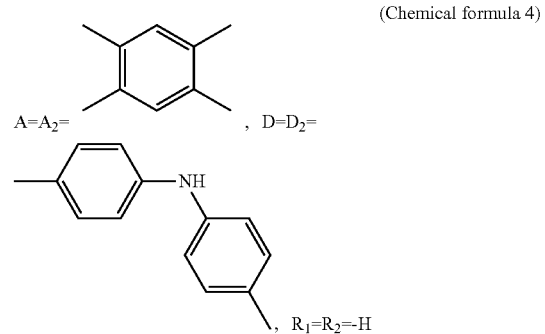

(Chemical formula 4)

Furthermore, for the component polymer 6' common to the alignment film layers, a random copolymer that the ratio of $A_1:A_2=D_1:D_2=$—$CH_3$:—H is 1:1 (this is referred to as a characteristic ratio) was selected from a molecular framework expressed by Chemical formula 2.

The molecular weights of these polyamic acids were found from polystyrene-converted molecular weights by gel permeation chromatography (GPC) analysis, and were 16,000, 14,000, and 13000, respectively. The polyamic acids were dissolved in a mixture of various solvents such as butyl cellosolve, N-methylpyrrolidone, and γ-butyrolactone in a predetermined ratio. A thin film was formed by coating the solution on a predetermined base substrate by flexographic printing, temporarily dried at a temperature of 40° C. or more, and imidized in a baking furnace at a temperature of 150° C. or more. The conditions for forming the thin film were adjusted in advance as the film thickness in the formation of the film was about 100 nm.

Subsequently, in order to provide the liquid crystal alignment regulating force by breaking a part of the molecular framework of the polymer compound with polarized light, polarized ultraviolet rays at a dominant wavelength of 280 nm were condensed and applied to the thin film using an ultraviolet ray lamp (a low-pressure mercury lamp), a wire grid polarizer, and an interference filter. After the application, a film was prepared, which foreign substances on the surface were removed by heating, drying, and the like (this is referred to as heat treatment). In the preparation, the quantity of polarized ultraviolet rays applied was changed in a range of 20 to 2,000 mJ/cm$^2$, and the irradiation conditions when the anchoring force reached the maximum was defined as the optimum irradiation light quantity of the film. The results below were comparisons and studies of the characteristics in the optimum irradiation light quantity.

Table 1 in FIG. 10 is the evaluation results (the anchoring force, the initial film strength, the relative film strength, and the luminance relaxation constant) of the obtained films and IPS liquid crystal display devices using the films. Here, a comparative example was formed in which the mixing ratio of the component polymer 4 of the first alignment film layer to the component polymer 5 of the second alignment film layer was fixed to 1:1 and the common component polymer 6' was not added, and then characteristics were compared when the loading of the common component polymer 6' was changed from 1 to 30%. In the comparison, the anchoring force that expresses the size of liquid crystal alignment regulating force is hardly changed within a range of 1.4 to 1.6 mJ/m$^2$ when the ratio of the common component polymer 6' is up to 12%, whereas the anchoring force is decreased when the ratio is 20% or more.

In contrast to this, for the film strength, although the initial film strength is hardly changed within a range of 0.67 to 0.74 kN/m regardless of the ratio of the common component polymer 6', the relative film strength is increased as the ratio of the common component polymer 6' is increased, and thus the resistance is increased to damage caused by polarized ultraviolet rays in association with the photo-alignment process, whereas the comparative example becomes fragile as the relative film strength is 35%. Moreover, in the comparison of the luminance relaxation constant as liquid crystal display devices, when the ratio of the common component polymer 6' is in a range of 1 to 20%, the luminance relaxation constant takes a value smaller than in the comparative example, and the afterglow characteristics of the liquid crystal display device are improved. It was confirmed that these samples were configured of the first alignment film layer and the second alignment film layer formed below the first alignment film layer by SEM observation of the cross sections by way of precaution.

From the description above, in the liquid crystal display device including the first alignment film layer contacting the liquid crystal layer and having at least one kind of polyimide and the second alignment film layer formed below the first alignment film layer and having at least one kind of polyimide in which the first alignment film layer is a material that is enabled to provide liquid crystal alignment regulating force by applying polarized light, it was confirmed that in the liquid crystal display device using the alignment film formed of the first alignment film layer and the second alignment film layer that contain the common polyimide structure, the mechanical strength of the alignment film is improved as well as the performance of the liquid crystal display device is also improved.

Second Embodiment

Next, the result will be described with reference to the drawing and a table that alignment films and liquid crystal display devices were prepared similarly to the procedures of the first embodiment using the common component polymer 6' composed in another characteristic ratio and the characteristics were compared.

In other words, the same ones as in the first embodiment were used for the component polymer 4 of the first alignment film layer and the component polymer 5 of the second alignment film layer, and for the common component polymer 6', one in the characteristic ratio=4:6 was used. The other conditions are the same as the conditions in the first embodiment.

Table 2 in FIG. 11 is the evaluation results (the anchoring force, the initial film strength, the relative film strength, and the luminance relaxation constant) of the obtained films and IPS liquid crystal display devices using the films. Here, a comparative example was formed in which the mixing ratio of the component polymer 4 of the first alignment film layer to the component polymer 5 of the second alignment film layer was fixed to 1:1 and the common component polymer 6' was not added, and then characteristics were compared when the loading of the common component polymer 6' was changed from 1 to 30%. In the comparison, the anchoring force that expresses the size of liquid crystal alignment regulating force is hardly changed within a range of 1.4 to 1.6 mJ/m$^2$ when the ratio of the common component polymer 6' is up to 20%, whereas the anchoring force is decreased when the ratio is 20% or more. More preferable ratios are up to 12% based on the experimental result.

In contrast to this, for the film strength, although the initial film strength is hardly changed within a range of 0.67 to 0.79 kN/m regardless of the ratio of the common component polymer 6', the relative film strength is increased as the ratio of the common component polymer 6' is increased, and thus the resistance is increased to damage caused by polarized ultraviolet rays in association with the photo-alignment process, whereas the comparative example becomes fragile as the relative film strength is 35%. Moreover, in the comparison of the luminance relaxation constant as liquid crystal display devices, when the ratio of the common component polymer 6' is in a range of 1 to 20%, the luminance relaxation constant takes a value smaller than in the comparative example, and the afterglow characteristics of the liquid crystal display device are improved.

From the description above, in the liquid crystal display device including the first alignment film layer contacting the liquid crystal layer and having at least one kind of polyimide and the second alignment film layer formed below the first alignment film layer and having at least one kind of polyimide in which the first alignment film layer is a material that is enabled to provide liquid crystal alignment regulating force by applying polarized light, it was confirmed that in the liquid crystal display device using the alignment film formed of the first alignment film layer and the second alignment film layer that contain the common polyimide structure, the mechanical strength of the alignment film is improved as well as the performance of the liquid crystal display device is also improved.

Third Embodiment

Next, the result will be described with reference to the drawing and a table that alignment films and liquid crystal display devices were prepared similarly to the procedures of the first embodiment using the common component polymer 6' composed in another characteristic ratio and the characteristics were compared. In other words, the same ones as in the first embodiment were used for the component polymer 4 of the first alignment film layer and the component polymer 5 of the second alignment film layer, and for the common component polymer 6', one in the characteristic ratio=6:4 was used. The other conditions are the same as the conditions in the first embodiment.

Table 3 illustrated in FIG. 12 is the evaluation results (the anchoring force, the initial film strength, the relative film strength, and the luminance relaxation constant) of the obtained films and IPS liquid crystal display devices using the films. Here, a comparative example was formed in which the mixing ratio of the component polymer 4 of the first alignment film layer to the component polymer 5 of the second alignment film layer was fixed to 1:1 and the common component polymer 6' was not added, and then characteristics were compared when the loading of the common component polymer 6' was changed from 1 to 30%.

In the comparison, the anchoring force that expresses the size of liquid crystal alignment regulating force is hardly changed within a range of 1.4 to 1.6 mJ/m$^2$ when the ratio of the common component polymer 6' is up to 8%, whereas the anchoring force is decreased when the ratio is 12% or more. In contrast to this, for the film strength, although the initial film strength is hardly changed within a range of 0.64 to 0.71 kN/m regardless of the ratio of the common component polymer 6', the relative film strength is increased as the ratio of the common component polymer 6' is increased, and the resistance is increased to damage caused by polarized ultraviolet rays in association with the photo-alignment process, whereas the comparative example becomes fragile as the relative film strength is 35%. Moreover, in the comparison of the luminance relaxation constant as liquid crystal display devices, when the ratio of the common component polymer 6' is in a range of 1 to 12%, the constant takes a value smaller than in the comparative example, and the afterglow characteristics of the liquid crystal display device are improved. From the overall results, the samples according to the embodiment exhibit excellent characteristics more than in the comparative example when the ratio of the common component polymer 6' is in a range of 1 to 12%, and a more preferable range is the case where the ratio of the common component polymer 6' is in a range of 1 to 12%.

From the description above, in the liquid crystal display device including the first alignment film layer contacting the liquid crystal layer and having at least one kind of polyimide and the second alignment film layer formed below the first alignment film layer and having at least one kind of polyimide in which the first alignment film layer is a material that is enabled to provide liquid crystal alignment regulating force by applying polarized light, it was confirmed that in the liquid crystal display device using the alignment film formed of the first alignment film layer and the second alignment film layer that contain the common polyimide structure, the mechanical strength of the alignment film is improved as well as the performance of the liquid crystal display device is also improved.

Fourth Embodiment

Next, the following fact will be described with reference to the drawing and a table in which the alignment film according to the embodiment of the present invention is in a state of a liquid solution uniformly dissolved in a solvent immediately before the alignment film is coated on a substrate and the phase separation state appears in the liquid solution state by heating after the alignment film is coated on the substrate.

Table 4 illustrated in FIG. 13 is a list of the heating conditions variously changed as temporary drying conditions from the process after the liquid solution was coated on the substrate to the process before the thermal imidization reaction. Here, a heating temperature was changed from a temperature of 50 to 180° C., and heating time was changed from one to five minutes. (Condition 5 is taken as a standard condition in the first to the third embodiments, although not described specifically.)

Table 5 illustrated in FIG. 14 is the result of the observation of the cross sectional structures of the obtained alignment films. Here, DL expresses the case where a uniform two-layer structure was recognized throughout the film surface as in FIG. 9, MD expresses the case where a two-layer structure was partially observed or unclear, and AM expresses the case where a completely unclear image was obtained. From the result, it is revealed that although depending on the ratio of the common component polymer 6', a two-layer structure easily appears in a heating temperature range of 70 to 150° C., and an effect is exerted in heating time of one minute or longer, or a two-layer structure easily appears in longer hours. On the other hand, in the case where the alignment film was imidized immediately after the alignment film was coated, no two-layer structure was observed in any ratios, and it is assumed that polymer components immediately after the alignment film was coated were distributed in an amorphous state. Moreover, no two-layer structure was also observed at a temperature of 180° C. or more, and it is estimated that thermal imidization reactions already proceed at a temperature of 180° C. or more and the flowability of the polymers to achieve the phase separation state is not obtained.

From the description above, it was revealed that the alignment film according to an embodiment of the present invention is in a state of a liquid solution uniformly dissolved in a solvent immediately before the alignment film is coated on a substrate and the phase separation state appears in the liquid solution state by heating after the liquid solution is coated on the substrate.

What is claimed is:
1. A liquid crystal display device comprising:
   a TFT substrate having a pixel electrode and a TFT, and formed with an alignment film on the pixel electrode;
   a counter substrate disposed opposite to the TFT substrate, and formed with another alignment film on a top surface on the TFT substrate side, the alignment film of the TFT substrate facing the another alignment film of the counter substrate; and
   a liquid crystal layer sandwiched between the alignment film of the TFT substrate and the another alignment film of the counter substrate;
   wherein the alignment film is configured of a first alignment film layer contacting the liquid crystal layer and having at least one kind of polyimide, and a second alignment film layer formed below the first alignment film layer, contacting it, and having at least one kind of polyimide;

wherein the first alignment film layer is a material that is enabled to provide liquid crystal alignment regulating force by applying polarized light;

wherein the first alignment film layer and the second alignment film layer separately contain a common polyimide structure;

wherein the common polyimide structure includes a first part of a repetition unit structure forming a first polyimide structure contained only in the first alignment film layer, and a second part of a repetition unit structure forming a second polyimide structure contained only in the second alignment film layer, the two parts being different; and wherein the common polyimide structure reinforces the mechanical strength of the first alignment film layer and decreases the interfacial peeling between the first alignment film layer and the second alignment film layer.

2. The liquid crystal display device according to claim 1, wherein: the alignment film is in a state of a liquid solution uniformly dissolved in a solvent immediately before the alignment film or the another alignment film is coated on the TFT substrate or the counter substrate; and a phase separation state appears in the liquid solution state by heating after the alignment film or the another alignment film is coated on the TFT substrate or the counter substrate.

3. The liquid crystal display device according to claim 1, wherein immediately before the alignment film or the another alignment film is coated on the TFT substrate or the counter substrate, a polyimide solution for the first alignment film layer and the second alignment film layer is not imidized and in a state of a liquid solution uniformly dissolved in a solvent; and a phase separation state appears in the liquid solution state by heating after the alignment film or the another alignment film is coated on the TFT substrate or the counter substrate.

4. The liquid crystal display device according to claim 1, wherein the common polyimide structure is present in a range of 1 to 20 wt % to the entire first alignment film layer, and the common polyimide structure is present in a range of 1 to 20 wt % to the entire second alignment film layer.

5. The liquid crystal display device according to claim 1, wherein the first alignment film layer is a photodecomposition type photo-alignment film.

6. The liquid crystal display device according to claim 1, wherein the first alignment film layer is a photodecomposition type photo-alignment film containing polyimide given by Chemical formula 1,

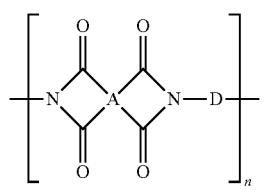

(Chemical formula 1)

where a formula in brackets expresses a chemical structure of a repetition unit, numerical subscript n expresses a number of the repetition unit, N expresses a nitrogen atom, O expresses an oxygen atom, A expresses a quadrivalent organic group containing a cyclobutane ring, and D expresses a divalent organic group.

7. The liquid crystal display device according to claim 1, wherein the alignment film has a structure in which two types of alignment films are stacked in a two-layer structure formed of a photo-alignable photo-alignment upper layer and a low resistive under layer having a resistivity lower than a resistivity of the photo-alignable photo-alignment upper layer.

8. The liquid crystal display device according to claim 1, wherein the liquid crystal display device is an IPS mode liquid crystal display device.

9. A manufacturing method for a liquid crystal display device including a TFT substrate having a pixel electrode and a TFT and formed with an alignment film on the pixel electrode, a counter substrate disposed opposite to the TFT substrate and formed with another alignment film on a top surface on the TFT substrate side, the alignment film on the TFT substrate facing the another alignment film of the counter substrate, and a liquid crystal layer sandwiched between the alignment film of the TFT substrate and the another alignment film of the counter substrate, the method comprising the steps of:

preparing the TFT substrate having the pixel electrode and the TFT;

preparing an alignment film material containing a blend of a first polymeric material having a first solubility parameter, a second polymeric material having a second solubility parameter different from the first solubility parameter, and a third polymeric material having a third solubility parameter between the first solubility parameter and the second solubility parameter;

subjecting a surface of the TFT substrate or the counter substrate to ozone water processing;

forming the alignment film on the TFT substrate or the another alignment film on the counter substrate using the alignment film material after the ozone water processing;

applying a polarized ultraviolet ray to the alignment film to provide a state of liquid crystal alignment regulating force on a top surface layer of the alignment film;

attaching the TFT substrate attached with the alignment film provided with alignment regulating force to the counter substrate; and filling the liquid crystal between the TFT substrate and the counter substrate in the attaching step or after the attaching step, wherein after forming the alignment film on the TFT substrate or the another alignment film on the counter substrate, the alignment film separates into a first alignment film layer and a second alignment film layer, wherein the first alignment film layer and the second alignment film layer separately contain a common polyimide structure, wherein the common polyimide structure includes a first part of the repetition unit structure forming a first polyimide structure contained only in the first alignment film layer, and a second part of a repetition unit structure forming a second polyimide structure contained only in the second alignment film layer, the two parts being different, and wherein the common polyimide structure reinforces the mechanical strength of the first alignment film layer and decreases the interfacial peeling between the first alignment film layer and the second alignment film layer.

10. The manufacturing method of a liquid crystal display device according to claim 9,
wherein after applying the polarized ultraviolet ray, the alignment film is oxidized.

11. The manufacturing method of a liquid crystal display device according to claim 10,
wherein after the step of forming the alignment film on the TFT substrate or the counter substrate, the substrate is held at a temperature of 100 to 150° C.

12. The manufacturing method of a liquid crystal display device according to claim 9,
wherein after the step of forming the alignment film on the TFT substrate or the counter substrate, the substrate is held at a temperature of 100 to 150° C.

* * * * *